US007338291B2

(12) United States Patent
Takada

(10) Patent No.: US 7,338,291 B2
(45) Date of Patent: Mar. 4, 2008

(54) INTERMEDIATE ELECTRICAL CONNECTOR DEVICE AND ITS CONNECTING STRUCTURE

(75) Inventor: Toshiyukj Takada, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 409 days.

(21) Appl. No.: 11/050,813

(22) Filed: Jan. 27, 2005

(65) Prior Publication Data

US 2005/0170675 A1 Aug. 4, 2005

(30) Foreign Application Priority Data

Jan. 30, 2004 (JP) ............................ 2004-022562

(51) Int. Cl.
*H01R 12/00* (2006.01)
*H05K 1/00* (2006.01)

(52) U.S. Cl. ........................ 439/65; 409/701; 409/76.1

(58) Field of Classification Search .................. 439/65, 439/61, 74, 76.1, 76.2, 906, 946, 608, 633, 439/686, 695; 361/796, 797, 756, 752, 801, 361/788, 790

See application file for complete search history.

(56) References Cited

U.S. PATENT DOCUMENTS 6,341,966 B1 * 1/2002 Takada et al. .............. 439/108
6,695,622 B2 * 2/2004 Korsunsky et al. ........... 439/65
6,918,774 B2 * 7/2005 Wu ............................ 439/65
2004/0229509 A1 * 11/2004 Consoli et al. ............. 439/608

FOREIGN PATENT DOCUMENTS

JP 2001-143786 5/2001

* cited by examiner

*Primary Examiner*—Felix Figueroa
(74) *Attorney, Agent, or Firm*—Takeuchi & Kubotera, LLP

(57) ABSTRACT

An intermediate electrical connector device, which easily enables "floating", includes an intermediate board (20) having two connecting sections (23A) and (24A), which are respectively formed at the edges (23) and (24), to connect between two connecting bodies (40) and (40'), and a holding body to hold the intermediate board between two connecting sections. The holding body is divided into a plurality of sub-members (10) and (10') at a surface perpendicular to the fitting direction between the two connecting bodies. The intermediate board is held by one of the sub-members through at least partial fitting, and forms space from another sub-member. The sub-members can be displaced relative to each other on the surface perpendicular to the fitting direction at least one direction parallel and perpendicular to the intermediate board.

15 Claims, 7 Drawing Sheets

INTERMEDIATE ELECTRICAL CONNECTOR DEVICE AND ITS CONNECTING STRUCTURE

BACKGROUND OF THE INVENTION

1. Field of the Invention

The present invention relates to an intermediate electrical connector device to electrically connect two facing connecting bodies via an intermediate board, and relates to its connecting structure.

2. Description of the Related Art

JP 2001-143786 discloses an intermediate connector to connect two facing connectors, which are respectively mounted onto two circuit boards, via an intermediate connector.

As shown in FIG. 7, the intermediate connector 50 of this patent reference comprises a holding body 51, which is referred to as "guide frame", and an intermediate board, which is held by the holding body 51.

The holding body 51 has a columnar section 53 arranged on the right and left sides, and a flat joint section 54, which extends in the lateral direction and joint between the columnar sections 53. One of the columnar sections 53 has a catch 53A, and the other columnar section 53 has an elastic catch 53B, on the respective sides facing the jointing section 54. In addition, each columnar section 53 has a locking protrusion 53C.

On the other hand, the intermediate board 52 (circuit is not illustrated in the figure) has the same length in the lateral direction as that of the joint section 54, and has protrusions 52A and 52B to be held at the sides. In addition, the intermediate board 52 has a hole 52C provided on the center part in the longitudinal direction, and grooves 52D above and below the hole 52C as shown in the figure. Many connecting sections (not illustrated) such as connecting lands are arranged with narrow pitch as contacts at the upper and lower edges of the intermediate board 52.

On use, an intermediate connector 50 is first attached to each of two sides of the jointing section 54 of the holding body 51. This attachment can be done by positioning the protrusion 54A and the hole 52C, and then the intermediate board is held by the holding body through locking the protrusions 52A and 52B into position by the catch 53A and the elastic catch 53B.

Then, the intermediate connector 50 is connected to a connector (not illustrated), which is mounted on a circuit board. This connection can be done by electrically connecting between the connecting section provided on the lower edge of the intermediate board 52 to a terminal of the connector, and the lower end of each columnar section 53 is fitted to the engaging hole of the connector so as to mechanically engage thereto. Then, the locking protrusion 53C is locked into the engaging hole of the connector and prevented from coming off.

Furthermore, another connector (not illustrated), which is mounted on another circuit board, is connected to the upper edge side of the intermediate board 52 of the intermediate connector. The connector is electrically connected at the connecting section of the upper edge of the intermediate board 52, and is mechanically engaged with the upper end part of each columnar section 53.

Accordingly, two circuit boards are connected by the above-described intermediate connector 50.

However, the intermediate connector of the above patent reference has several problems.

First, the holding body 51 is formed as one piece and has large rigidity, so that it can be hardly elastically deformed. For this reason, two intermediate boards 52 attached to the holding body have to be attached having some looseness at the catch in the thickness direction of the intermediate board, in order to enable positioning in the thickness direction, i.e. "floating". However, since the intermediate board is positioned by the center hole and the protrusion of the joint section in order to precisely position many contacts of each intermediate board, the protrusion is tightly fitted into the hole, and floating in the thickness direction cannot be securely obtained even with looseness. On the other hand, in order to securely obtain the floating, the fitting between the hole and the protrusion has to be loosened, which destabilizes the position of the contacts between the two intermediate boards in the arranging direction, and therefore, the precision in positioning of connection with the terminal of the counter connector becomes reduced. Accordingly, in order to secure the precision in positioning, in addition to floating in the thickness direction of the intermediate board, floating in the longitudinal direction, i.e. arrangement direction of the contacts, cannot be obtained.

Second, since only two intermediate boards can be used, there is limitation in the number of contacts that can be created by the intermediate connectors. If the number of contacts is increased by the two intermediate boards, the intermediate boards have to be very long in the lateral direction, and correspondingly, the counter connector also has to be very long, which is not preferable for attaching to the circuit board of the counter connector.

SUMMARY OF THE INVENTION

Accordingly, it is an object of the invention to provide an intermediate electrical connector, which is improved to enable flexible floating and increase the number of contacts at the time of connecting with the counter connector to desired number, and to provide the connecting structure.

According to the invention there is provided an intermediate electrical connector device, which is comprised of an intermediate board, which has a connecting section at two parallel edges to electrically connect two connecting bodies by fitting them to the edges, and a holding body to hold the intermediate board in a position between the two connecting sections.

In the intermediate electrical connector device of this invention, the holding body is divided into a plurality of sub-members at a surface perpendicular to the fitting direction between the two connecting sections of the intermediate board held by the holding body, and the sub-members are jointed to each other. The intermediate board is held by one sub-member through at lest partial fitting, and has space relative to the other sub-members. The sub-members can move relative to each other in at least one of directions, which is parallel or perpendicular to the intermediate board in the surface perpendicular to the fitting direction.

In such invention, the holding body is comprised of a plurality of sub-members, and the intermediate board is held by one sub-member and has a degree of freedom relative to other sub-members. Therefore, floating of the intermediate board can be obtained by displacement among the sub-members. At this time, the direction of the floating can be set any, and the displacement can be either shifting (sliding) displacement or elastic displacement.

In this invention, sub-members are jointed via joint members, and it is possible to design such that the relative displacement between the sub-members and the joint members can be obtained. As a result, the displacement among the sub-members, i.e. floating of the intermediate board, can be obtained. The displacement among the sub-members and between the sub-members and the joint members can be either relative movement or elastic deformation.

When elastic displacement is made between the sub-members and the joint members, the sub-members can be designed to have elastic arms to lock the joint members, so that relative displacement between the sub-members and the joint members can be obtained by elastic deformation of the elastic arms.

Each sub-member has a plurality of receiving grooves, which are arranged in rows to receive intermediate boards parallel to each other. Each receiving groove is divided into two sections at a dividing section in the middle part of the groove in the longitudinal direction. The dividing section has a holding section, where a notch formed at an edge of the intermediate board is fitted and held at least in the longitudinal direction of the groove.

If the receiving groove is formed to have a width to keep space from the intermediate board, has a protrusion on the two facing inner surfaces such that the positions are different in the longitudinal direction of the groove, and the distance between the protrusions in the groove width direction is generally same as the thickness of the intermediate board, positioning of the intermediate board can be precisely and stably done in the thickness direction of the intermediate board by the protrusions. In addition, since the distance between the grooves can be made small, the portion between the grooves can be flexible, which enables floating of the intermediate board in the direction.

If the receiving groove is formed to have a depth that places the intermediate board including the connecting section therein, staining of the connecting section by accidentally touching by a finger or something can be prevented, so that protection effect can be obtained. By providing to the sub-member a guide frame to receive and fit the outer wall of the connecting body, the fitting to the connecting body can be made easy, and the connecting body can be fitted and held securely. In this case, if the guide frame is formed to have larger height in the fitting direction than the intermediate board, which is held by the sub-member, the space at the both sides between the intermediate board and the guide frame is too small to put a finger therein, and therefore the connecting section is protected. As for other intermediate boards, intermediate boards are protected by each other by arranging a plurality of intermediate boards with relatively small pitch.

The present invention also relates to the holding body of the intermediate electrical connector device, and also to a connector connecting structure, in which the above-described intermediate board connector device is used. The holding body is comprised as described above, and the connector connecting structure is composed by using a connector mounted to a circuit board as the connecting body.

In this connector connecting structure, if the intermediate board is held at least in the longitudinal direction of the groove by a notch formed at one edge of the intermediate board through fitting to the holding section of one sub-member, and loosely fitted to the holding section of the other sub-member, floating can be obtained. In this invention, the holding body of the intermediate connector is formed by jointing a plurality of sub-members, the intermediate board is held by one of the sub-members and has a degree of freedom relative to other sub-members, and the sub-members are jointed so as to be able to displace. Therefore, the intermediate connector can float in the direction of the freedom at the time of connecting with the counter connector. In addition, since a plurality of intermediate boards can be used, the number of contacts can be increased as much as desired. In this case, since the plurality of intermediate boards is held by one sub-member and their positions are fixed to each other, the positions of the contacts in the arranging direction of the intermediate boards will not be off from each other. Even in this case, floating relative to the counter connector is possible due to the above-described reason.

DESCRIPTION OF THE PREFERRED EMBODIMENTS

Figure 1:
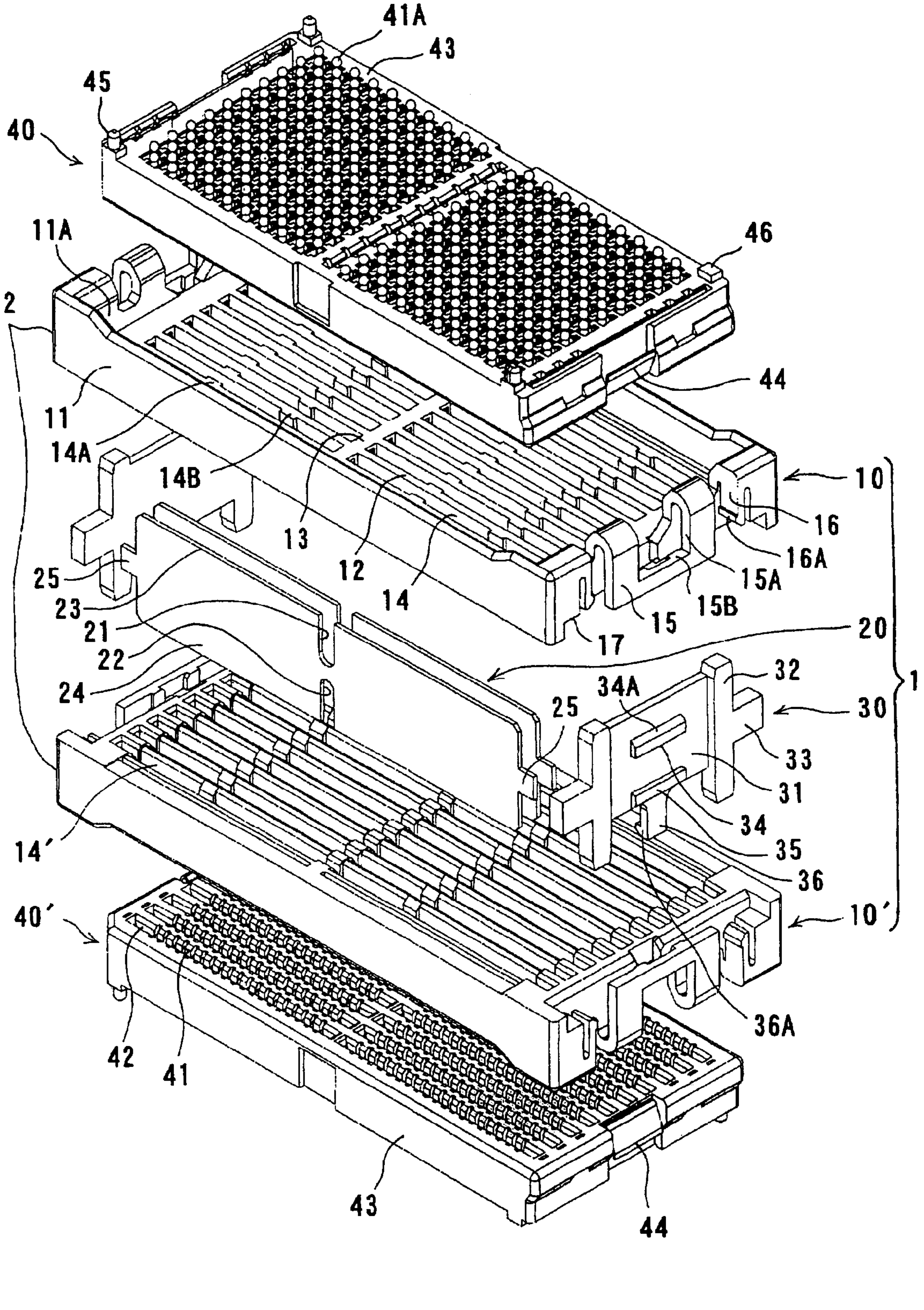
FIG. 1 is a perspective view of the embodiment of the intermediate connector device of this invention, which also separately illustrates each member of connector as a connecting body by the intermediate connector device.

Embodiments of the invention will now be described with reference to the accompanying drawings, FIGS. 1-6. FIG. 1 illustrates an embodiment of the intermediate connector device of this invention, and also separately illustrates two connecting bodies, which are to be connected to the intermediate connector device. In FIG. 1, the two connecting bodies are illustrated as connectors as an example.

In FIG. 1, the intermediate connector device 1 of this embodiment comprises a holding body that is comprised of two sub-members 10 and 10', an intermediate board 20 held by the sub-members, and a joint member 30 to joint the sub-members. In this embodiment, the two sub-members 10 and 10', which are arranged above and below the intermediate connector, are identically formed, but the lower sub-member 10' is arranged upside down with regard to the upper sub-member 10. In addition, the upper and lower counter connectors 40 and 40', which are connecting bodies to be connected to the intermediate connector from upper/lower side, are also identically formed, and respectively attached to a circuit board that is not illustrated in the figure. In FIG. 1, the upper connector 40 and the lower connector 40' are respectively attached to the upper surface and the lower surface of the circuit board by soldering balls provided on a terminal, and electrically connected thereto. As described above, the sub-members 10 and 10' and the connectors 40 and 40' are identically formed. Therefore, only one of each, the sub-member 40 and the connector 40, will be mainly described in the description below.

The sub-member 10 is made of an electrical insulating material, and molded as one-piece component, which comprises a frame 11 having a rectangular shape on its top view, a plurality of parallel lateral members 12 extending in the frame 11 along the longitudinal direction of the frame 11, and a longitudinal members 13 extending so as to connect the lateral members 12 at the center position in the longitudinal direction. The frame 11 has a main arm 15 and sub-arms 16, which are elastically deformable and extend from outer surfaces of circumferential walls of the frame 11, which face each other in the longitudinal direction of the frame 11.

The frame 11 of the sub-member 10 has a guide frame 11A at the circumferential wall, which has a height so as to be above the edges of the intermediate board coming out from the upper surface defined by the lateral members 12 and the longitudinal member 13. The inner surface of the guide frame 11A guides the connector 40 so as to fit the connector therein. The lateral members 12 form receiving grooves 14, which penetrate in the vertical direction, between adjacent lateral members 12. Those receiving grooves 14 are for receiving the edges of the intermediate boards, which will be described later. In the figure, nine receiving grooves 14 are respectively formed on the both left and right sides of the longitudinal member 13 along the arranging direction of the lateral members. In other words, this longitudinal member 13 works as a divider to divide the receiving grooves that extend along the lateral members 12. The divider has holding sections 13A to hold the intermediate boards, which will be described later (See FIG. 3).

Figure 2:
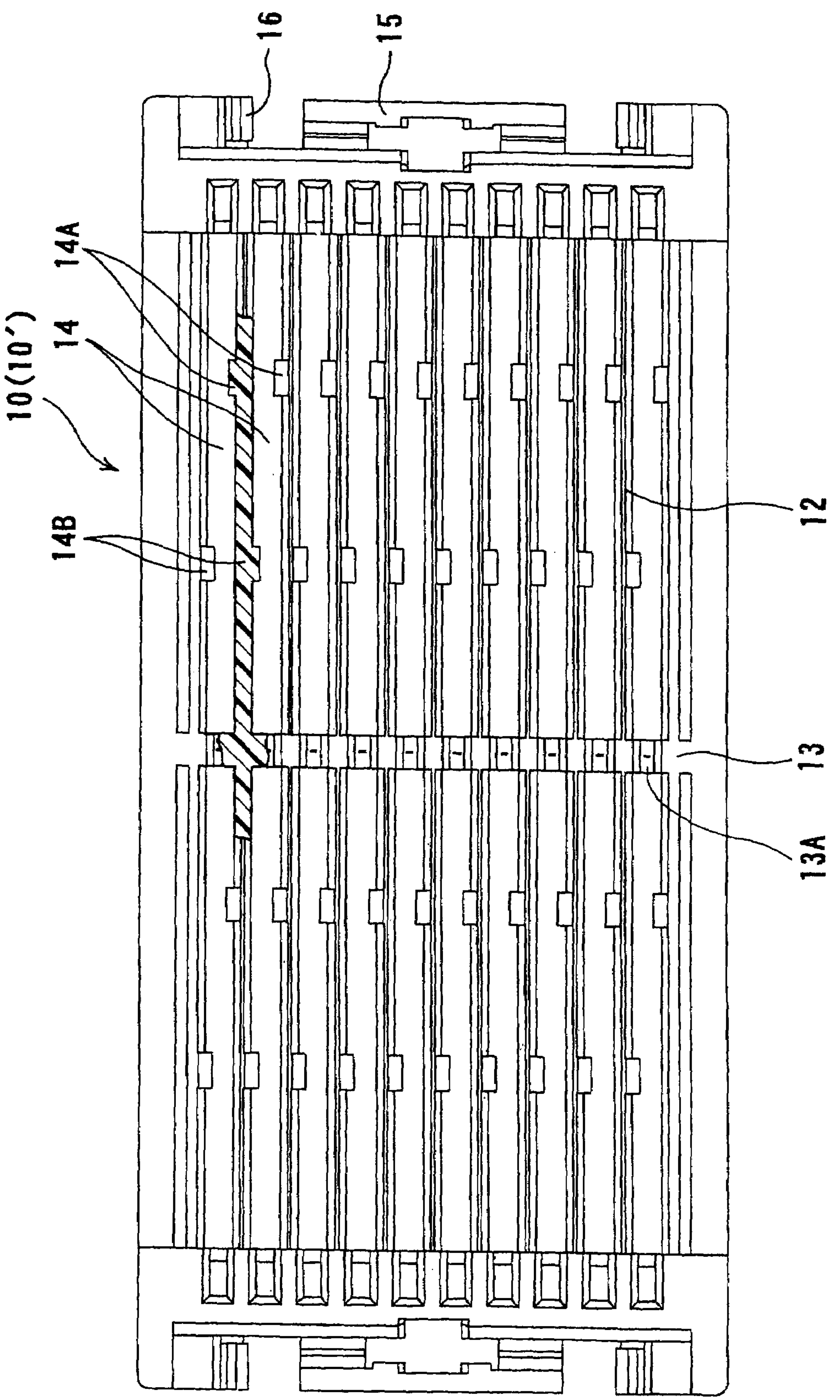
FIG. 2 is a top view of the sub-member of the device of FIG. 1.
Figure 3:
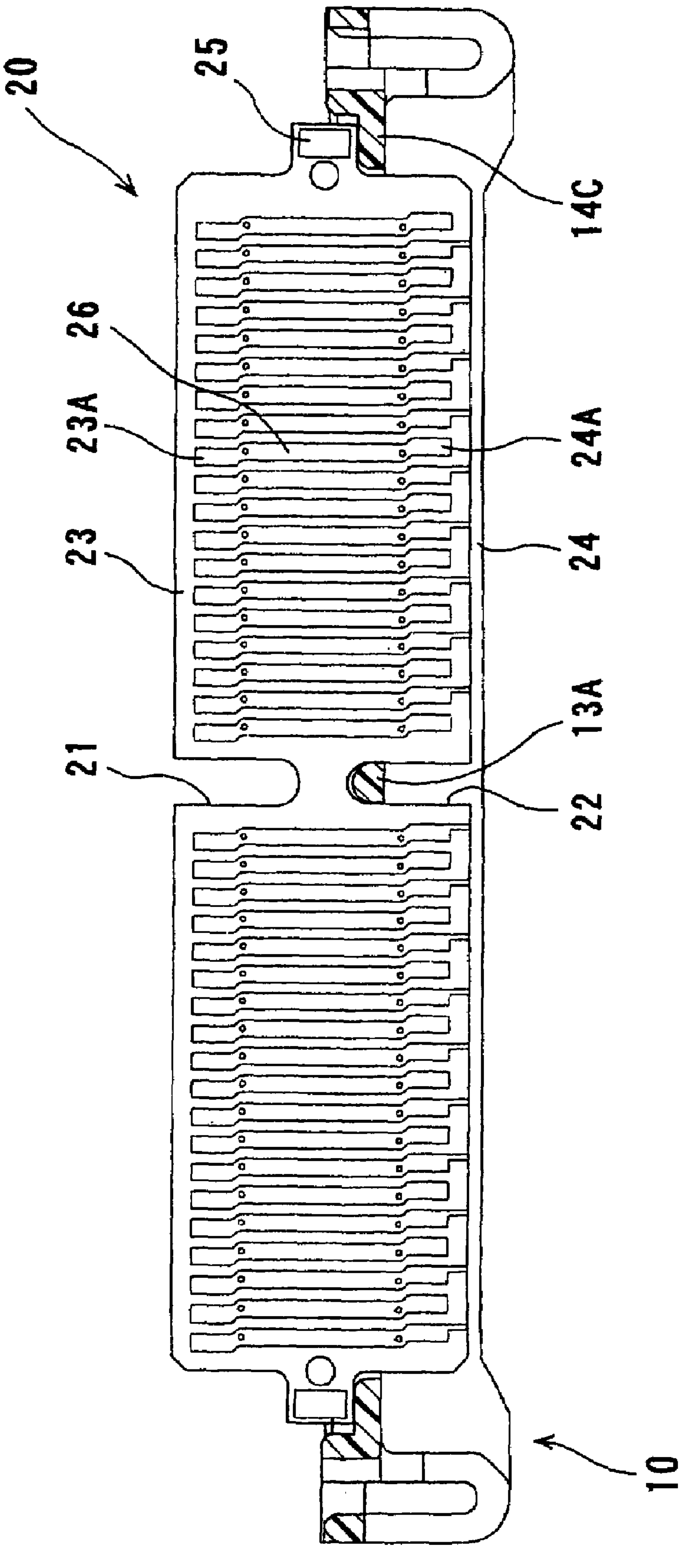
FIG. 3 is a front view of the intermediate board used for the device of FIG. 1.

As shown in FIG. 3, each holding section 13A has a generally semicircular cross-section. As also shown in FIG. 2, two facing inner surfaces of each receiving groove have protrusions 14A and 14B, which are disposed at different positions in the longitudinal direction of the receiving groove. The distance between those protrusions 14A and 14B in the groove width direction is set same or slightly larger than the thickness of the intermediate board as will be described later. Therefore, when the intermediate boards are placed in the grooves, gaps are formed between the inner surfaces of the grooves and the intermediate boards but other than where those protrusions are formed. Here, in this embodiment, lower edges of each receiving groove 14 (upper edges of each receiving groove in case of the lower sub-member 10') are tapered so that intermediate boards can be easily placed therein.

A main arm 15 and sub-arms 16, which can elastically deform at their respective free ends and have inverted U-shaped cross-section, are provided from the outer surfaces of two sides of the frame, which face each other in the longitudinal direction of the frame 11. The main arm 15 is provided at the center part of the outer surface of each side wall of the frame, and the sub-arms are provided on the outer surface at the both side of the main arm on the outer surface. The direction of displacement is different perpendicularly different between the main arm 15 and the sub-arm 16. The main arm 15 deforms vertically to the outer surface of the side wall of the frame 11 so as to be close-to/away-from the outer surface of the frame 11. On the other hand, each sub-arm 16 can deform along the surface. In addition, the main arm 15 has an inverted U-shaped cross-section, and its upper center part is cut off so as to form U-shape when it is viewed on the surface. The cut-away section 15A of the main arm has a locking surface 15B. The sub-arm 16 has an inverted U-shaped cross-section, and has a contact protrusion 16A at the outer surface of the free end. Each sub-arm and the main arm are provided so as to be specified distance away from each other.

The intermediate boards 20 are provided corresponding to the number of the receiving grooves 14 of the sub-member 10. In FIG. 1, since grooves are arranged in nine rows in the sub-member 10, nine intermediate boards can be placed. In this figure, only two of them are illustrated. As also shown in FIG. 3, each intermediate board 20 has grove-like notches 21 and 22 to receive the holding section of each sub-member 10 and 10' at the center part of the upper and lower edges. The upper and lower edges 23 and 24 extend both sides of the notches 21 and 22 so as to fit to the two receiving grooves 14, which extend at both sides of the holding section of the sub-member 10. The groove width of the lower notch 22 is set to fit to the holding section 13A, while the groove width of the upper notch 21 is larger than that of the lower notch 22. Accordingly, while the lower groove 22 is held by fitting to the holding section 13A at its bottom part, the upper notch 21 has degree of freedom by loosely fitting to the holding section 13A of the upper sub-member.

As shown in FIG. 3, "island-like" connecting sections 23A and 24A to contact with a plurality of terminals (not illustrated) of the connectors 40 and 40' are arranged with a pitch interval that corresponds to that of the terminals along the edges 23 and 24. The corresponding connecting sections 23A and 24A on the upper and the lower edges 23 and 24 are short-circuited by the circuit sections 26 formed on the board surface. Here, the connecting sections 23A and 24A and the circuit section 26 are illustrated in FIG. 3, but not illustrated in FIG. 1. In addition, a protrusion 25 as a stopper protrudes from the side edges of the intermediate board 20 in the longitudinal direction. Each protrusion 25 is to control the depth of respective insertion of the upper and the lower edges 23 and 24 so as to insert them to a specified depth when the upper and they are placed in the corresponding receiving grooves 14 and 14' of the sub-member 10 and 10'. The protrusion 25 is locked into position by the edge section 14C of the receiving groove 14 (See FIG. 3).

The above-described notches 21 and 22 can be formed in same manufacturing process as cutting process for forming the outer shape of the intermediate board 20. Furthermore, they can be formed simultaneously when all the intermediate boards are formed. Therefore, the notches 21 and 22 can be precisely formed corresponding to the outer shape of the intermediate board 20, so that the positions of the connecting sections of all the intermediate boards held at the notches 21 can be highly precise in the arranging direction of the connecting sections. Conventionally, the outer shape and the positioning hole had to be processed in different processes, so that the positions of the connecting sections tended to be uneven among the intermediate boards, which is dramatically improved in this invention.

As shown in FIG. 1, the joint member 30 has a flat section 31 at its center part, and columnar sections 32, which extend vertically along the side edges of the flat section 31. A protrusion 33 is formed from the columnar section so as to protrude sidewise. Furthermore, an upper locking section 34 and a lower locking section 35 are formed in the lateral direction being away from each other on the outer surface of the flat section 31 and protrude from the outer surface of the flat section 31. The upper edge of the upper locking section 34 has a tapered section 34A. In addition, a locking leg 36 protrudes from the lower edge of the flat section 31. The locking leg 36 has a catch 36A at its end on the inner surface.

The columnar section 32 is designed such that the upper part than the protruding section 33 is inserted between the main arm and the sub-arms 16 of the sub-member 10, and displaces the sub-arm 16 pressing the contact protrusion 16A of the sub-member 16. Simultaneously, the flat section 31 is inserted from its upper part into the groove-like space, which is formed by the inverted U-shape of the main arm 15 of the sub-member 10 and is opened downward, to a specified position causing elastic displacement of the main arm 15 with the upper locking section 34. Then, each protrusion 33 contacts with the step section 17 of the sub-arm 16, and the upper locking section 34 contacts with the notch 15A of the main arm 15, so that the elastic displacement is released, and the joint member is locked into position by the locking surface 15B, which prevents the joint member from coming off. The main arms 15 of the upper and lower sub-members 10 and 10' are received between the upper locking section 34 and the lower locking section 35. The upper locking section 34 and the lower locking section 35 are locked thereon by the respective surfaces 15B. Similarly to when the upper end of each columnar section is locked into position by the upper sub-member 10, the lower end of each columnar section is locked by the lower sub-member 10'.

Figure 4:
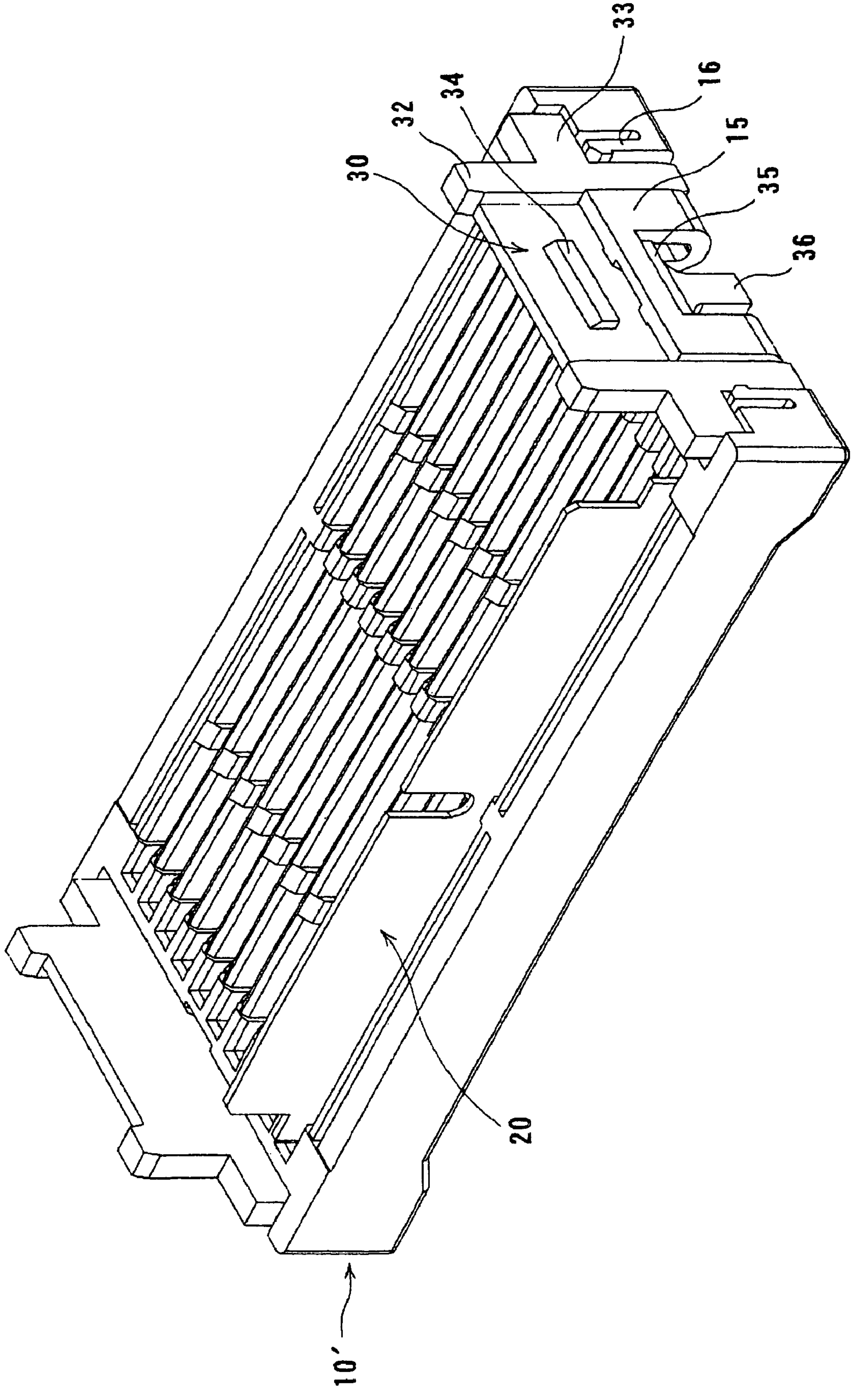
FIG. 4 is a perspective view of the lower sub-member and the joint members, to which only one intermediate board is attached.
Figure 5:
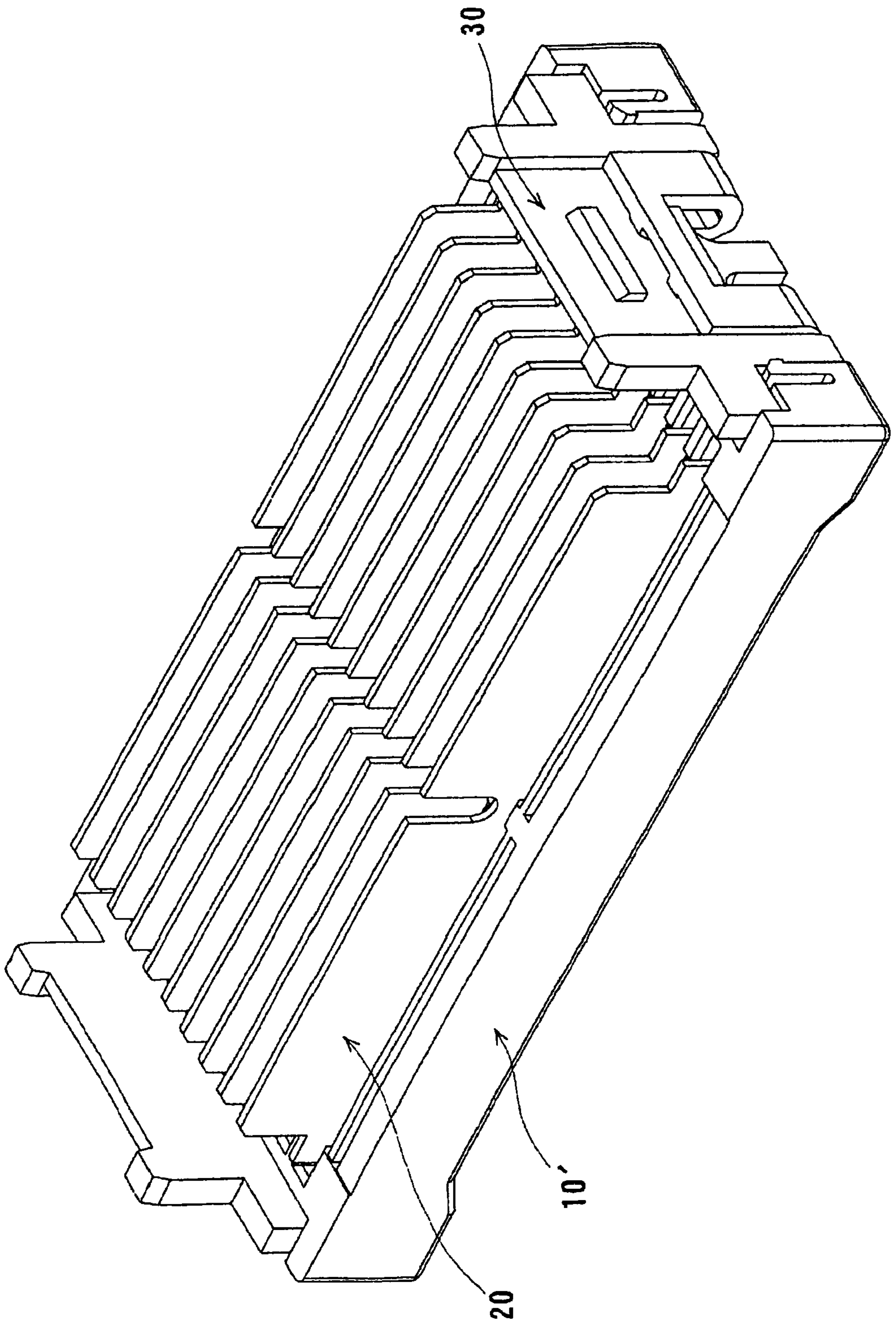
FIG. 5 is a perspective view of the sub-member and joint members, to which all the intermediate boards are attached.
Figure 6:
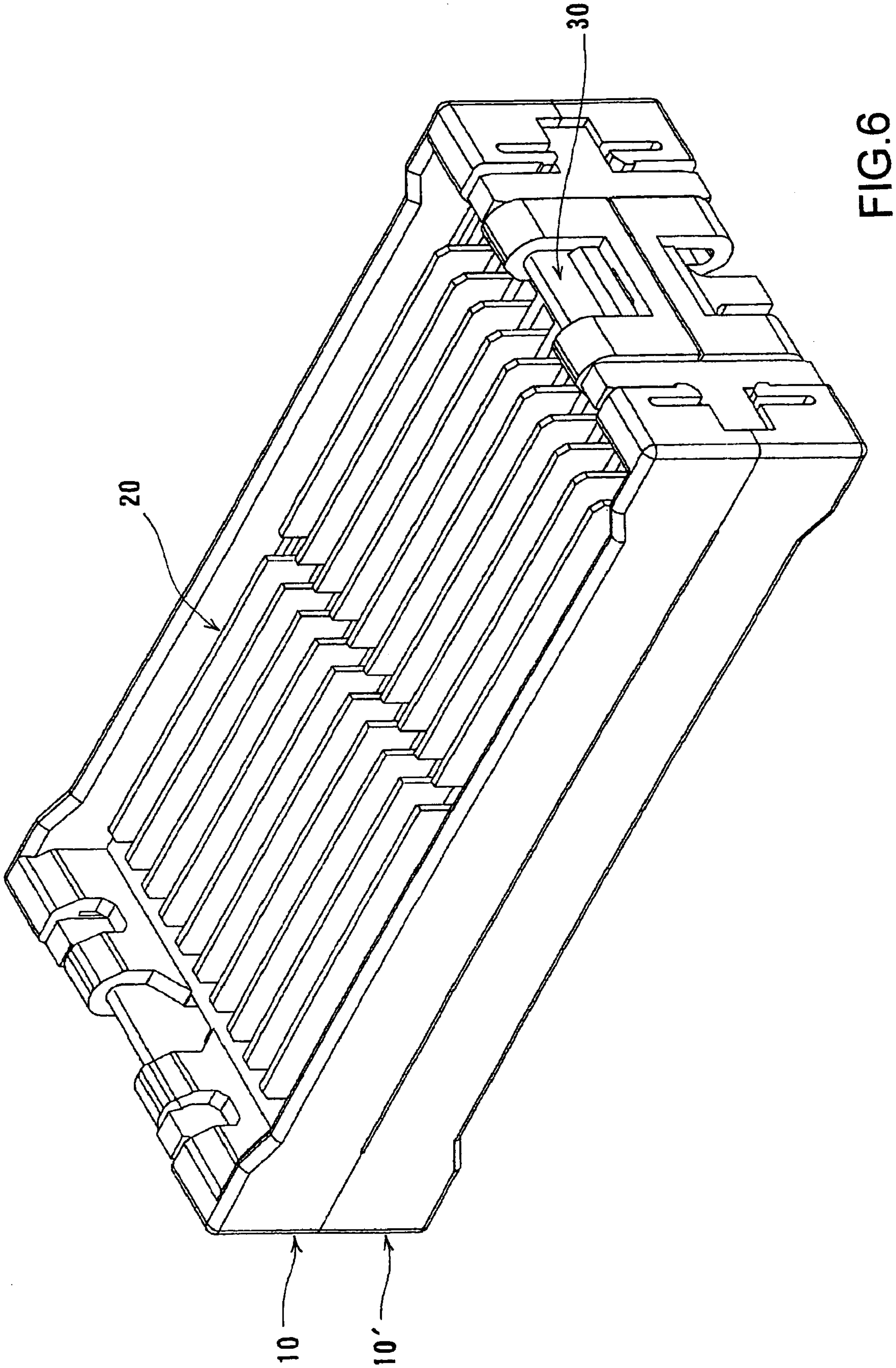
FIG. 6 is a perspective view of the intermediate connector device which is completed by further attaching the upper sub-member onto the lower sub-member of FIG. 5.
Figure 7:
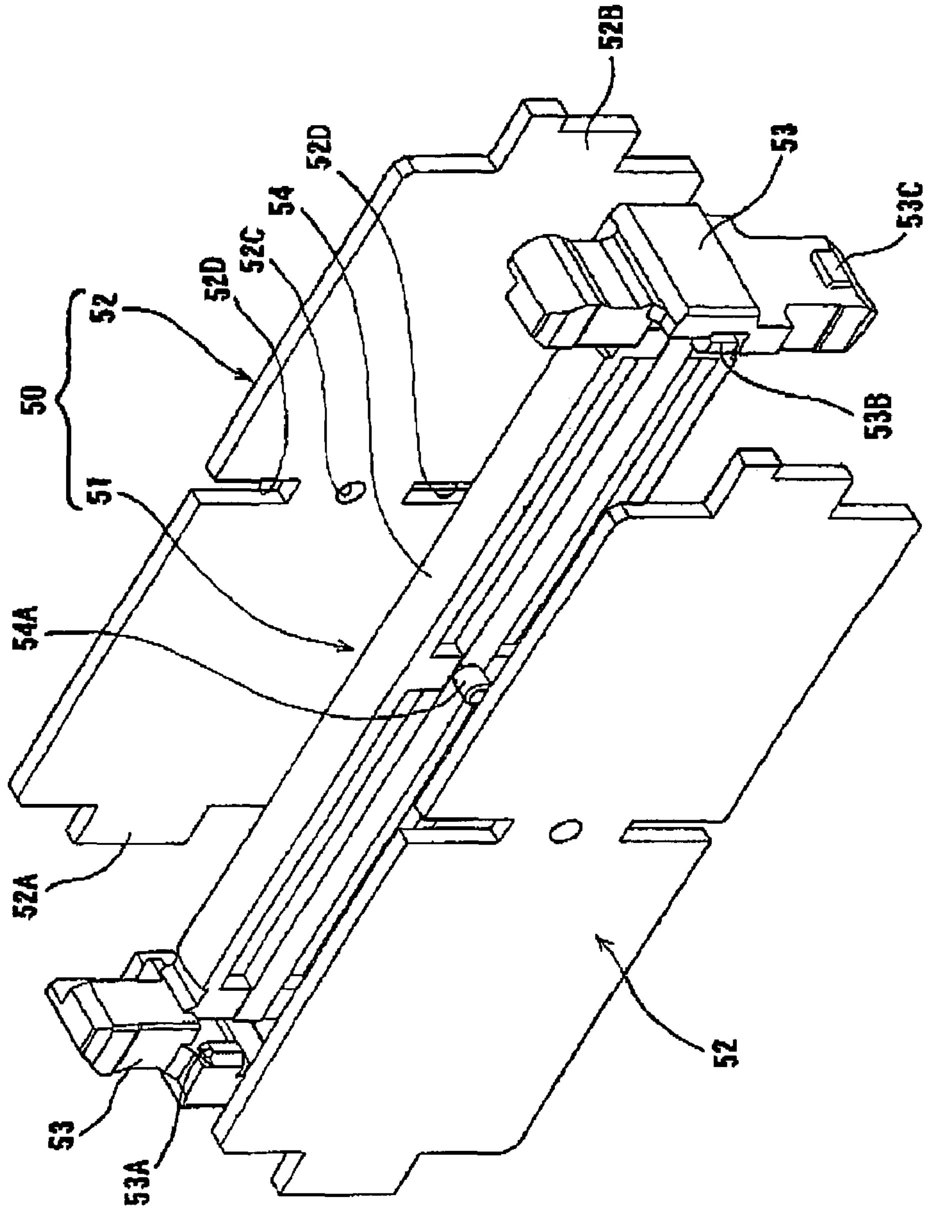
FIG. 7 PRIOR ART
FIG. 7 is an exploded perspective view of the conventional intermediate connector device.

In FIG. 4, the joint members 30 are jointed to the lower sub-member 10' and only one intermediate board is attached to the sub-member 10'. In FIG. 5, all the intermediate boards are attached to the sub-member. In FIG. 6, the upper sub-member is further attached to the lower sub-member of FIG. 5. The connectors 40 and 40' illustrated in FIG. 1 are identical, and only the connector 40 will be described in the description below. The connector 40 is connected to the intermediate connector device via the intermediate boards 20. There is no limitation in the form of connector, but in this example, the connector 40 is formed such that terminals 41 to be fitted and connected to the connecting sections 23A and 24A of the upper edge 23 and the lower edge 24 of the intermediate boards 20 are arranged in grooves 42 (In FIG. 1, the terminals 41 are shown on the upper surface side of the lower connector 40'). A locking protrusion 44 is provided at each side surface of the housing 43 of the connector 40, and can lock the sub-member with the catch 36A, which is formed at the end of the locking leg 36 of each joint member 30.

As seen on the upper surface of the upper connector 40, the connector 40 has soldering balls 41 on the protrusions of the terminals 41 on the upper surface to be attached to the circuit board (not illustrated). In addition, cylindrical protrusion 45 and a rectangular protrusion 46 for positioning the connector relative to the circuit board are provided at four corners of the housing 43 of the connector 40.

Such intermediate connector device 1 as described above can be used as will be described below for example.

(1) First, connectors mounted on circuit boards are prepared by attaching the upper and the lower connectors 40 and 40' to corresponding circuit board, and then electrically connecting respective terminals 41 to corresponding circuits by soldering balls 41A.

(2) The joint members 30 are attached to the lower sub-member 10' (See FIG. 4).

(3) Then, all the intermediate boards 20 are attached to the sub-member 10', to which the joint members 30 are attached (See FIG. 5). The intermediate boards 20 are fitted to the holding sections 13A of the sub-member 10' at the respective lower notches 22, and held thereby (See FIG. 3). The intermediate boards 20 are received in the receiving grooves 14 of the sub-member 10' at the lower edges 24, and supported in the thickness direction of the intermediate board 20 by the facing protrusions in the receiving grooves 14.

(4) Thereafter, the upper sub-member is jointed to the lower sub-member 10' via the joint members 30. At this time, the joint is made similarly to the one between the joint members 30 and the lower sub-member 10' (See FIG. 6). Accordingly, the intermediate connector device 1 is completed by the sub-members 10 and 10' and the joint members 30.

(5) Then, the lower sub-member 10', which is jointed to the upper sub-member 10 via the joint members 30, is mounted to the connector 40', which is mounted on a circuit board. At this time, the connector 40' and the sub-member 10' guide each other at the inner surfaces of the guide frames (See the guide frame 11A of the sub-member 10) of the sub-member 10' and are positioned. In addition, the lower edge of each intermediate board 20 penetrates the receiving groove 14 of the sub-member 10, and the connecting sections 24A (See FIG. 3) formed at the lower edge 24 are electrically connected to the terminals 41 of the connector 40'. The joint members 30 are jointed to the sub-member 10' at the lower end of each columnar section 32, and then jointed to the connector 40' by locking the locking leg 36 and the catch 36A into position by the locking protrusions 44 of the connector 40'. Accordingly, coming off of the intermediate connector device 1 from the connector 40' is prevented.

(6) Lastly, the upper connector, which is mounted on a circuit board, is placed in the guide frames 11 of the upper sub-member 10, and the terminals of the connector are electrically connected to the connecting sections 23A, which are provided at the upper edge 23 of the intermediate board 20 that penetrates the receiving grooves 14 of the sub-member 10.

(7) Accordingly, two connectors 40 and 40' are electrically connected via the intermediate boards 20.

(8) The above-described two sub-members 10 and 10' are jointed via the joint members 30. The main arm 15 and the sub-arms 16 can be elastically displaced, and the directions of the elastic displacement of those arms are perpendicular to each other. Accordingly, when displacement of circuit boards attached to the connectors 40 and 40' is necessary along the circuit board surface for positioning, "floating" is generated in two perpendicular directions on the circuit board surface. Furthermore, flexing displacement of each intermediate board 20 itself in the receiving groove 14 at and around the protrusions 14A and 14B can be also made, which also enables "floating". In addition, since each intermediate board 20 is held by corresponding holding section 13A at the bottom of the notch 22, floating can be obtained by tilting each intermediate board in the thickness direction of the intermediate board 20 around the bottom.

In this embodiment, the order of assembling the sub-members 10 and 10', intermediate boards 20, the joint members 30, and the connectors 40 and 40' is not limited by the example described in (1)-(6), but can be any. For example, the lower sub-member 10' is first attached to the connector, which is mounted on a circuit board, and then all the intermediate boards are attached to the sub-member 10'. At the same time, the joint members 30 are attached to the sub-member 10', and then attached and locked to the connector 40'. Thereafter, the upper sub-member 10 is jointed to the lower sub-member 10' via the joint members 30. Lastly, the upper connector 40 mounted on a circuit board is placed in the guide frames 11A of the upper sub-member 10.

In this embodiment, parts are simplified by using identical sub-members 10 and 10' and identical connectors 40 and 40'. However, the lower connector 40' and the lower sub-member 10' can be formed as a one-piece component. Furthermore, in this invention, the connecting bodies to be connected via the intermediate connectors do not have to be connectors such as the ones illustrated in the figures, but can be other form of connector, or even do not have to be connectors and can be circuit bodies. Moreover, in the above-described embodiment, the holding body is comprised of two sub-members, but can be comprised of three or more sub-members. In this case, it can be designed such that the floating directions become different among the sub-members.

The invention claimed is:

1. An intermediate electrical connector device, comprising:

an intermediate board having connecting sections on two opposite edges to electrically connect two connecting bodies by respectively fitting them to said two opposite edges of said intermediate board;

a holding body to hold said intermediate board between said two edges, which is divided into a plurality of sub-members at a surface perpendicular to a fitting direction between said two edges of said intermediate board, which is held by said holding body, wherein, said intermediate board is held by one of said sub-members at least by partial fitting thereto, and has space relative to other intermediate boards, and said sub-members are displaced relatively to each other in said surface perpendicular to said fitting direction in at least one of directions, which is parallel or perpendicular to said intermediate board, said sub-member has a plurality of receiving grooves to place therein said plurality of intermediate boards parallel to each other, each of said receiving groove is divided into a plurality of parts with at least one dividing section formed at a middle portion of said groove in a longitudinal direction and said dividing section has a holding section, and each intermediate board is held at least in a longitudinal direction of said groove fitting to said holding section of one sub-member at a notch formed at one edge region of said intermediate board, and said receiving groove is formed to have a groove width suitable to keep space from said intermediate board, has two protrusions at different positions in said longitudinal direction of said groove on two facing inner surfaces, a distance between said protrusions in a groove width direction is substantially same as a thickness of said intermediate board.

2. The intermediate electrical board according to claim 1, wherein said sub-members are jointed via joint members, and sub-members and said joint members are displaced relatively to each other.

3. The intermediate electrical connector device according to claim 2, said displacement is displacement between said sub-members and said joint members by relative movement or elastic displacement.

4. The intermediate electrical connector device according to claim 3, wherein said sub-member has an elastic arm that locks said joint member into position, and can be displaced relative to said joint member by elastic deformation of said elastic arm.

5. The intermediate electrical connector device according to claim 3, wherein said sub-member has a plurality of receiving grooves to place therein said plurality of intermediate boards parallel to each other, each of said receiving groove is divided into two parts by a dividing section formed at a middle part of said groove in a longitudinal direction and said dividing section has a holding section, and each intermediate board is held at least in a longitudinal direction of said groove fitting to said holding section of one sub-member at a notch formed at one edge region of said intermediate board.

6. The intermediate connector device according to claim 2, wherein said sub-member has an elastic arm that locks said joint member into a position, and is displaced relative to said joint member by elastic deformation of said elastic arm.

7. The intermediate electrical connector device according to claim 6, wherein said sub-member has a plurality of receiving grooves to place therein said plurality of intermediate boards parallel to each other, each of said receiving groove is divided into two parts by a dividing section formed at a middle part of said groove in a longitudinal direction and said dividing section has a holding section, and each intermediate board is held at least in a longitudinal direction of said groove fitting to said holding section of one sub-member at a notch formed at one edge region of said intermediate board.

8. The intermediate electrical connector device according to claim 2, wherein said sub-member has a plurality of receiving grooves to place therein said plurality of intermediate boards parallel to each other, each of said receiving groove is divided into two parts by a dividing section formed at a middle part of said groove in a longitudinal direction and said dividing section has a holding section, and each intermediate board is held at least in a longitudinal direction of said groove fitting to said holding section of one sub-member at a notch formed at one edge region of said intermediate board.

9. The intermediate electrical connector device according to claim 2, wherein said sub-member has a guide frame to fit and receive an outer wall of said connecting body.

10. The intermediate electrical connector according to claim 1, wherein said displacement between said sub-members is displacement by relative movement or elastic displacement.

11. The intermediate electrical connector device according to claim 10, wherein said sub-member has a plurality of receiving grooves to place therein said plurality of intermediate boards parallel to each other, each of said receiving groove is divided into two parts by a dividing section formed at a middle part of said groove in a longitudinal direction and said dividing section has a holding section, and each intermediate board is held at least in a longitudinal direction of said groove fitting to said holding section of one sub-member at a notch formed at one edge region of said intermediate board.

12. The intermediate electrical connector according to claim 1, wherein said sub-member has a guide frame to fit and receive an outer wall of one of said connecting bodies.

13. The intermediate electrical connector according to claim 12, wherein said guide frame has a larger height in a fitting direction than said intermediate board, which is held by said sub-member.

14. The intermediate electrical connector according to claim 1, wherein each of said receiving grooves is formed to have a depth so as to be able to receive said intermediate board including its connecting section therein.

15. The intermediate electrical connector device according to claim 1, wherein each of said receiving grooves is formed to have a depth so as to be able to receive said intermediate board including its connecting section therein.

* * * * *